United States Patent
Toda et al.

(10) Patent No.: US 8,847,521 B2
(45) Date of Patent: Sep. 30, 2014

(54) ELECTRIC-VEHICLE CONTROL APPARATUS

(75) Inventors: Shinichi Toda, Fuchu (JP); Ikuo Yasuoka, Tama (JP); Yosuke Nakazawa, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/614,041

(22) Filed: Sep. 13, 2012

(65) Prior Publication Data

US 2013/0002172 A1 Jan. 3, 2013

Related U.S. Application Data

(63) Continuation of application No. PCT/JP2011/058104, filed on Mar. 30, 2011.

(30) Foreign Application Priority Data

Mar. 31, 2010 (JP) ................................. 2010-084342

(51) Int. Cl.
H02P 5/00 (2006.01)
(Continued)

(52) U.S. Cl.
CPC ............... *B60L 3/003* (2013.01); *B60L 3/0069* (2013.01); B60L 2200/26 (2013.01); H01L 25/18 (2013.01); B60L 2220/14 (2013.01); B60L 2210/40 (2013.01); Y02T 10/644 (2013.01); Y02T 10/7022 (2013.01); Y02T 10/7241 (2013.01); B60L 2240/525 (2013.01); *B60L 9/16* (2013.01); *B60L 11/005* (2013.01); *H02P 3/24* (2013.01); *B60L 3/04* (2013.01); Y02T 10/648 (2013.01); Y02T 10/646 (2013.01); *B60L 11/1803* (2013.01); B60L 2240/36 (2013.01); *B60L 15/007* (2013.01); Y02T 10/7005 (2013.01)
USPC ......... 318/51; 318/112; 318/722; 318/400.26

(58) Field of Classification Search
USPC ............. 318/51, 75, 83, 112, 400.26, 400.27, 318/400.28, 722; 361/641, 643, 676, 688, 361/694, 695, 697; 363/37, 55, 56.01, 363/56.02
See application file for complete search history.

(56) References Cited

U.S. PATENT DOCUMENTS 4,161,016 A * 7/1979 Born et al. ..................... 361/710
5,237,494 A * 8/1993 Baader et al. ................. 363/141
(Continued)

FOREIGN PATENT DOCUMENTS

EP 2 023 473 A2 2/2009
EP 2 157 685 A1 2/2010
(Continued)

OTHER PUBLICATIONS

International Search Report and Written Opinion issued May 17, 2011, in PCT/JP2011/058104 filed Mar. 30, 2011 (with English language translation).
(Continued)

*Primary Examiner* — Bentsu Ro
*Assistant Examiner* — Thai Dinh
(74) *Attorney, Agent, or Firm* — Oblon, Spivak, McClelland, Maier & Neustadt, L.L.P.

(57) ABSTRACT

According to one embodiment, four VVVF main circuit inverters for supplying electric power to drive a permanent-magnet synchronous motor are packaged into one unit. The four VVVF main circuit inverters are configured as a 4-in-1 inverter unit which shares a cooling mechanism for radiating heat generated due to power supply operation for the permanent-magnet synchronous motors to outside. A 2-in-1 semiconductor device package in which two semiconductor elements to convert electric power are packaged into one unit to be able to drive a permanent-magnet synchronous motor is contained in the 4-in-1 inverter unit. Thereby, individual control of inverters and reducing the size of the entire apparatus can be achieved for the electric-vehicle control apparatus.

14 Claims, 10 Drawing Sheets

(51) Int. Cl.

| | | |
|---|---|---|
| *B60L 3/00* | (2006.01) | |
| *B60L 9/16* | (2006.01) | |
| *B60L 11/00* | (2006.01) | |
| *H02P 3/24* | (2006.01) | |
| *B60L 3/04* | (2006.01) | |
| *B60L 11/18* | (2006.01) | |
| *B60L 15/00* | (2006.01) | |
| *H01L 25/18* | (2006.01) | |

(56) References Cited

U.S. PATENT DOCUMENTS

| | | | | |
|---|---|---|---|---|
| 5,619,111 | A * | 4/1997 | Katagiri et al. | 318/625 |
| 5,740,015 | A * | 4/1998 | Donegan et al. | 361/699 |
| 5,923,135 | A * | 7/1999 | Takeda | 318/432 |
| 6,431,297 | B1 | 8/2002 | Nakazawa | |
| 6,838,839 | B2 * | 1/2005 | Goto et al. | 318/139 |
| 7,541,758 | B2 * | 6/2009 | Inaba et al. | 318/140 |
| 7,561,429 | B2 * | 7/2009 | Yahata et al. | 361/715 |
| 7,567,053 | B2 * | 7/2009 | Hauenstein | 318/801 |
| 7,633,758 | B2 * | 12/2009 | Oohama | 361/717 |
| 7,960,937 | B2 | 6/2011 | Sumida et al. | |
| 8,058,849 | B2 * | 11/2011 | Yoshida et al. | 322/13 |
| 8,074,753 | B2 * | 12/2011 | Tahara et al. | 180/65.21 |
| 8,154,160 | B2 | 4/2012 | Kakuda et al. | |
| 8,159,823 | B2 * | 4/2012 | Murakami | 361/716 |
| 8,174,833 | B2 * | 5/2012 | Kitanaka et al. | 361/710 |
| 8,564,953 | B2 * | 10/2013 | Horiuchi et al. | 361/703 |
| 2002/0167825 | A1 * | 11/2002 | Okayama et al. | 363/37 |
| 2007/0008679 | A1 | 1/2007 | Takahasi et al. | |
| 2007/0076355 | A1 | 4/2007 | Oohama | |
| 2008/0129231 | A1 * | 6/2008 | Toda et al. | 318/112 |
| 2009/0114462 | A1 * | 5/2009 | Tahara et al. | 180/65.21 |
| 2010/0025126 | A1 | 2/2010 | Nakatsu et al. | |
| 2010/0277871 | A1 | 11/2010 | Kitanaka et al. | |
| 2012/0248909 | A1 * | 10/2012 | Ito et al. | 310/64 |

FOREIGN PATENT DOCUMENTS

| | | |
|---|---|---|
| JP | 11-340393 | 10/1999 |
| JP | 2002-335680 | 11/2002 |
| JP | 2004-18555 | 1/2004 |
| JP | 2005-328619 | 11/2005 |
| JP | 2006-49542 | 2/2006 |
| JP | 2009-72049 | 4/2009 |
| WO | WO 2008/075418 A1 | 6/2008 |
| WO | WO 2008/152686 A1 | 12/2008 |

OTHER PUBLICATIONS

European Search Report and Written Opinion mailed Apr. 22, 2013, in Singapore Patent Application No. 201206913-4 (in English-language).

Office Action mailed Aug. 13, 2013, in co-pending U.S. Appl. No. 13/276,154.

Office Action mailed Jan. 9, 2014, in co-pending U.S. Appl. No. 13/276,154.

Singapore Office Action mailed Apr. 22, 2013, in Singapore Patent Application No. 201206913-4 (in English-language).

* cited by examiner

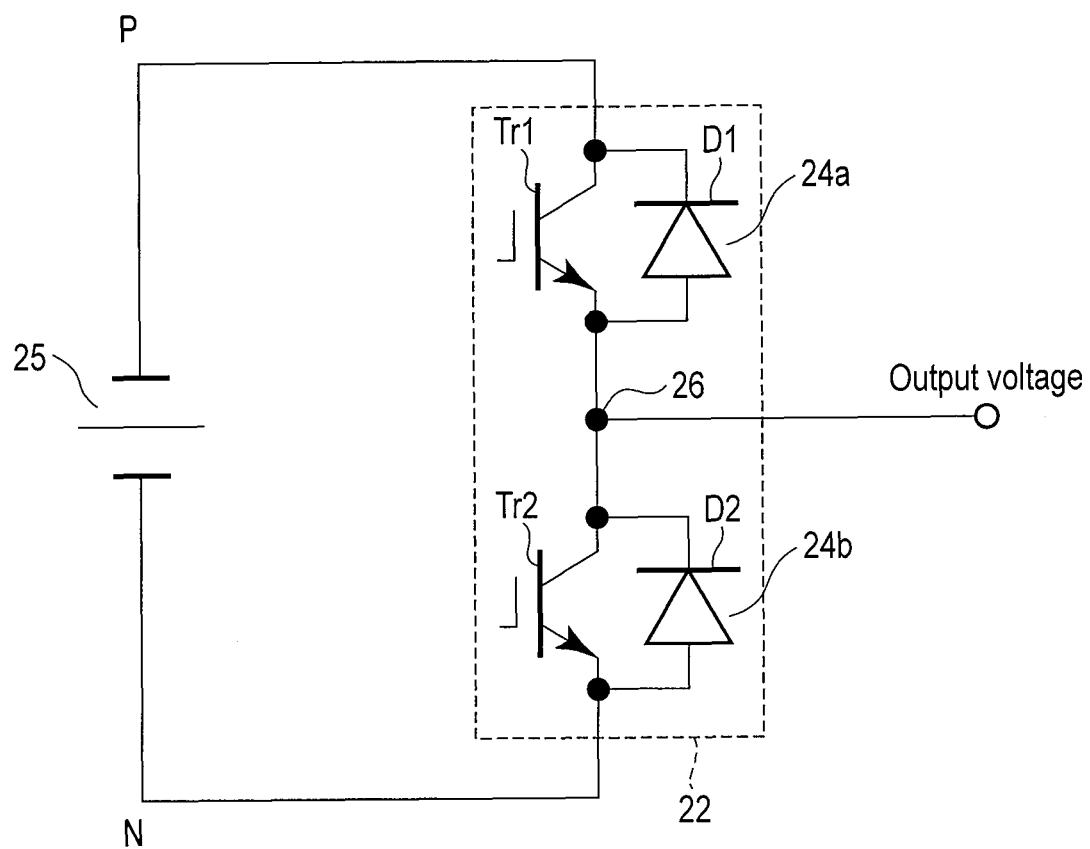
F I G. 2

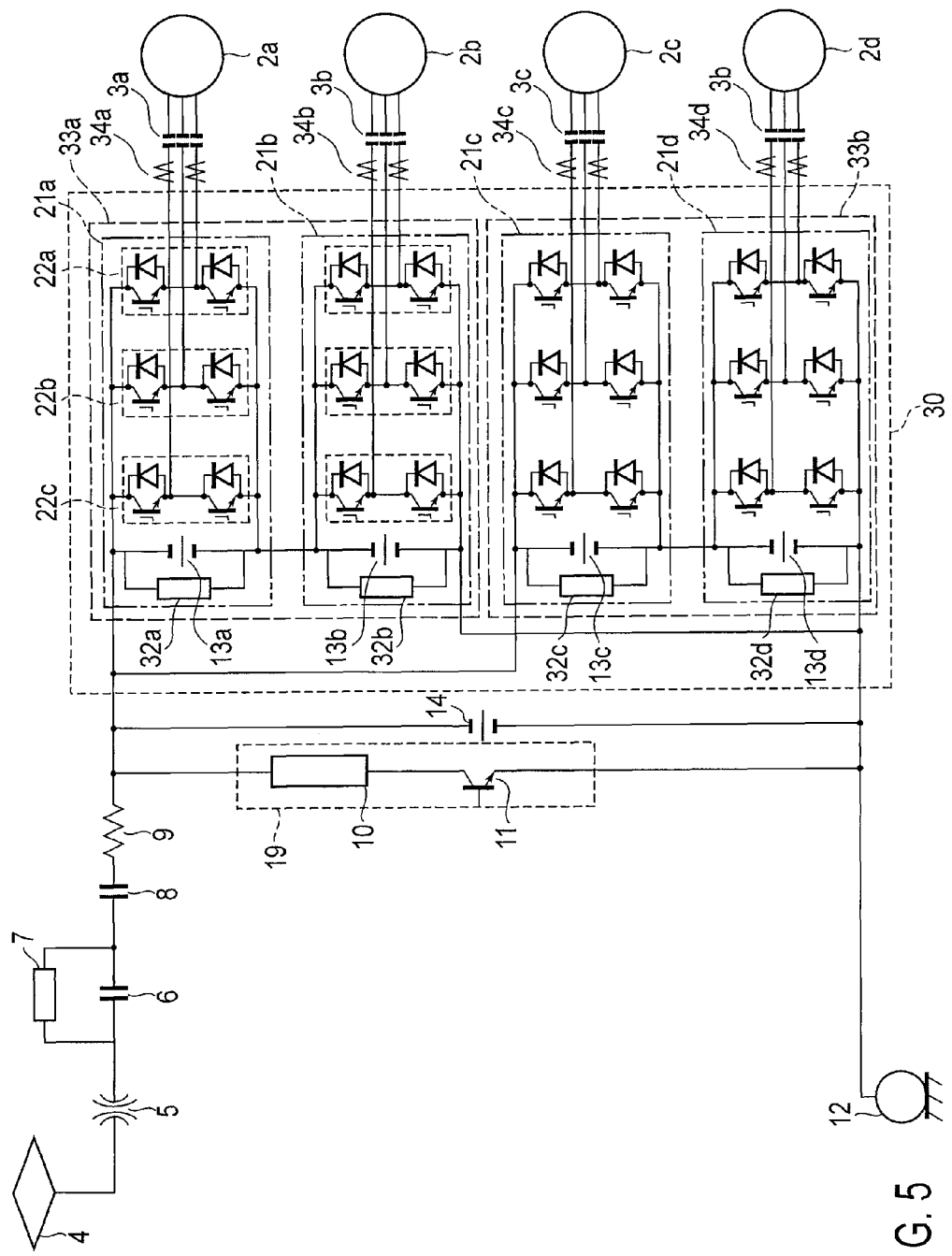
F I G. 5

ELECTRIC-VEHICLE CONTROL APPARATUS

CROSS REFERENCE TO RELATED APPLICATIONS

This application is a Continuation Application of PCT Application No. PCT/JP2011/058104, filed Mar. 30, 2011 and based upon and claiming the benefit of priority from prior Japanese Patent Application No. 2010-084342, filed Mar. 31, 2010, the entire contents of all of which are incorporated herein by reference.

FIELD

Embodiments described herein relate generally to an electric vehicle control apparatus using a cooling unit.

BACKGROUND

In general, a permanent-magnet synchronous motor can efficiently utilize energy and generate less heat, compared with an induction motor, and can therefore be easily subjected to weight reduction. Therefore, demands for a permanent-magnet synchronous motor have been increasing in recent years.

Such a permanent-magnet synchronous motor needs to be controlled by applying a voltage from a VVVF inverter in accordance with a rotation position of a rotor of each permanent-magnet synchronous motor. Therefore, individual control corresponding to each permanent-magnet synchronous motor is required. Accordingly, a special VVVF inverter is provided for each permanent-magnet synchronous motor, and a gate control apparatus for controlling each VVVF inverter is provided (for example, see Jpn. Pat. Appln. KOKAI Publication No. 2004-143577).

Therefore, the number of control apparatuses increases in a conventional system which controls individually each permanent-magnet synchronous motor. Increase in size of the entire apparatus and increase in costs have caused problems. Therefore, "trolley control" of controlling a permanent-magnet synchronous motor in control units of two motors is introduced, and increase in size of the apparatus is reduced (for example, Jpn. Pat. Appln. KOKAI Publication No. 2009-72049).

FIG. 9 is a circuit diagram of an electric-vehicle control apparatus which introduces conventional trolley control. Line power is supplied to a first main circuit 200 and a second main circuit 300 through a current collector (pantograph) 100, a high-speed breaker 101, a charging-resistance shortcircuit switch 102, a charging resistor 103.

The first main circuit 200 comprises: a first opening contact device 104; a first filter reactor 105; an overvoltage limit circuit comprising a first overvoltage limit resistor 107 and a first overvoltage limit resistor switch 108; a first and a second direct voltage detector 109a, 109b; a first and a second inverter filter capacitor 110a, 110b; a VVVF inverter 111a, 111b forming a 2-in-1 inverter unit 120a.

VVVF inverter 111a for the permanent-magnet synchronous electric motor 115a converts a power-line current as a direct current into an alternating current. The converted alternating current is supplied as a drive force to a permanent-magnet synchronous motor 115a through a current sensor 112a connected to a three-phase line, an electric-motor release contactor 113a, and an electric-motor internal voltage detector 114a. VVVF inverter 111a and VVVF inverter 111b are configured in the same manner as each other, and are connected in series with each other. The inverters form a 2-in-1 inverter unit 120a and share one heat radiator.

The second main circuit 300 is configured in the same manner as the first main circuit 200. The 2-in-1 inverter unit 120a and 2-in-1 inverter unit 120b are connected in parallel with each other. As a ground, a wheel 116 is connected to each of the 2-in-1 inverter unit 120a and the 2-in-1 inverter unit 120b.

FIG. 10 is a block diagram showing a gate control system of an electric-vehicle control apparatus shown in FIG. 9. As shown in FIG. 10, the 2-in-1 inverter unit 120a is provided with an overvoltage-limit controller element 107 and a gate control apparatus 130 for controlling VVVF inverters 111a and 111b. The inverter unit 120b is also configured in the same manner as above. In the figure, equal numerals surrounded by circles indicate that connection is made to each other. The power supply for the gate control apparatus (common controller 131) is provided for each set of 2-in-1 inverter units 120a and 120b.

The gate control apparatus 130 controls, by itself, VVVF inverters 111a and 111b and on/off of the overvoltage-limit control element 108. Therefore, output currents detected by current sensors CTU1, CTW1, CTU2, and CTW2 for VVVF inverters 111a and 111b, and an electric-motor internal voltage based on electric-motor internal-voltage detectors 114a and 114b are input to the gate control apparatus 130.

The output of the 2-in-1 inverter unit 120a is connected to each of the permanent magnet synchronous motors 115a and 115b. Control units depend on individual control methods. The release conductor 104 and filter reactor 105 are provided respectively for VVVF inverters 120a and 120b, and control units each are 2-in-1 inverter units for electric motors.

In a conventional electric-vehicle control apparatus for a permanent-magnet synchronous motor using a 2-in-1 inverter unit, a large number of semiconductor elements need to be equipped. For each 2-in-1 inverter unit, a filter reactor, an overvoltage limit resistor, and an overvoltage limit control resistor switch are provided. Therefore, a large number of components are used, which makes it difficult to reduce the size of the entire apparatus.

One embodiment has an object of providing an electric control apparatus capable of individually controlling a permanent-magnet synchronous motor and reducing the size of the entire apparatus.

BRIEF DESCRIPTION OF THE DRAWINGS

FIG. 2 is an equivalent circuit diagram of a semiconductor device package according to the first embodiment;

FIG. 5 shows a circuit configuration of the third embodiment;

DETAILED DESCRIPTION

Various embodiments will be described hereinafter.

In general, according to one embodiment, there is provided an electric-vehicle control apparatus including: an inverter unit comprising a plurality of inverters each configured by a U-phase circuit, a V-phase circuit, and a W-phase circuit; and a cooling mechanism, the plurality of inverters provided on the cooling mechanism and sharing the cooling mechanism, wherein the U-phase, V-phase, and W-phase circuits each are configured as a semiconductor device package including two semiconductor switching elements contained in one package and in series.

Hereinafter, embodiments will be described with reference to the drawings.

First Embodiment

The first embodiment of the invention will be described with reference to the drawings.

Figure 1:
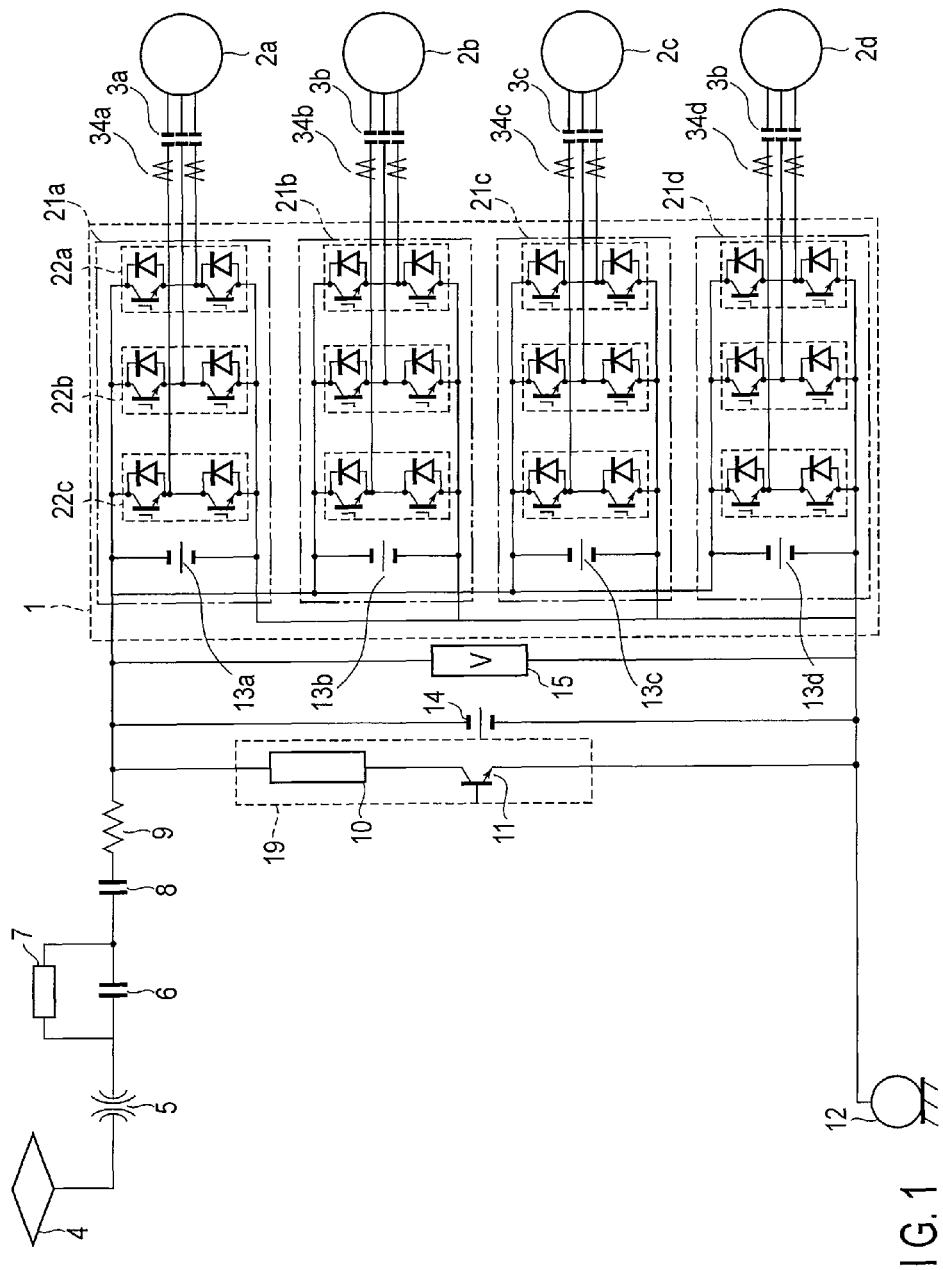
FIG. 1 shows a circuit configuration of the first embodiment.
Figure 3:
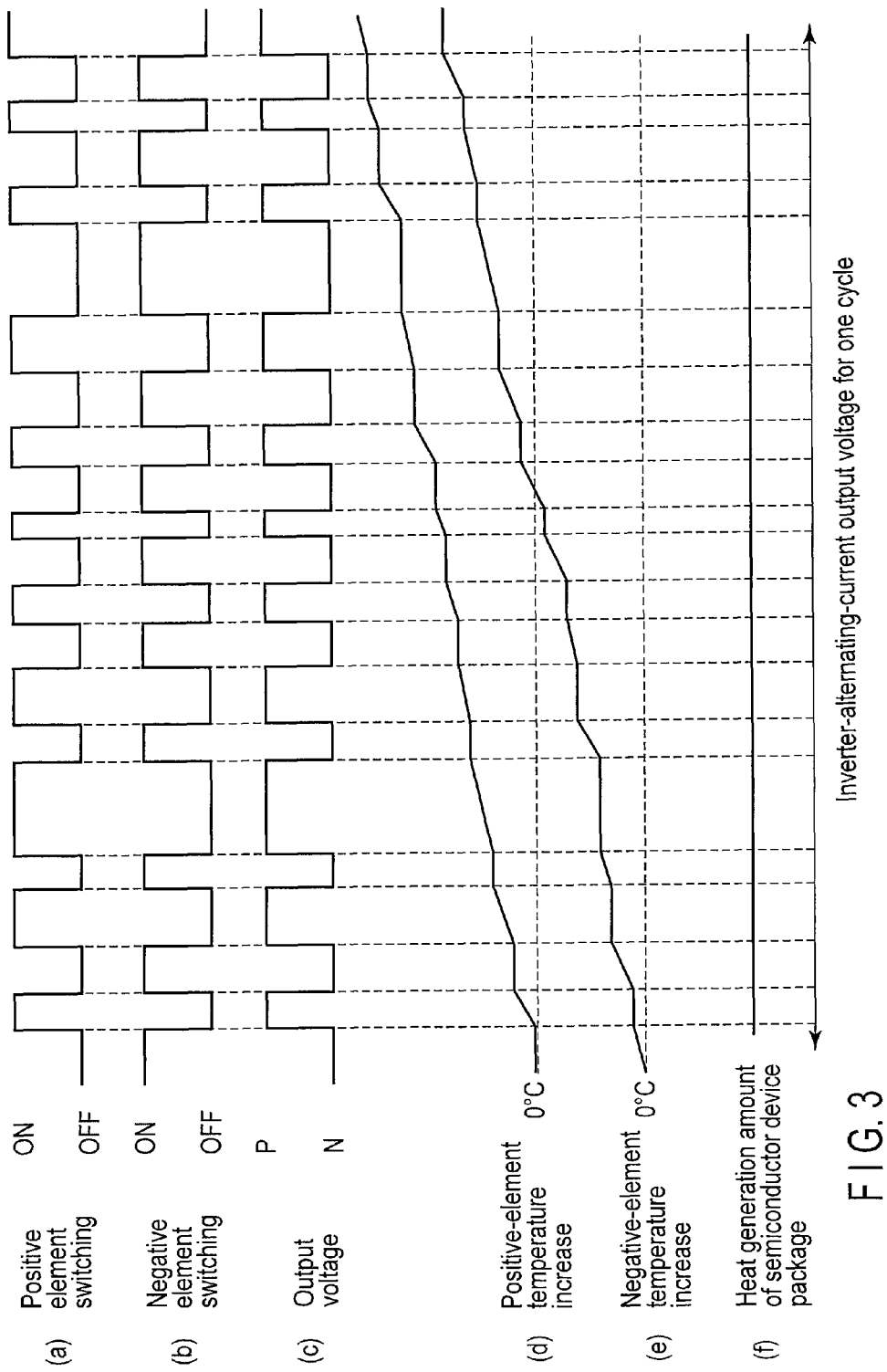
FIG. 3 is a chart showing a voltage output and a temperature increase of a semiconductor device package according to the first embodiment.
Figure 4:
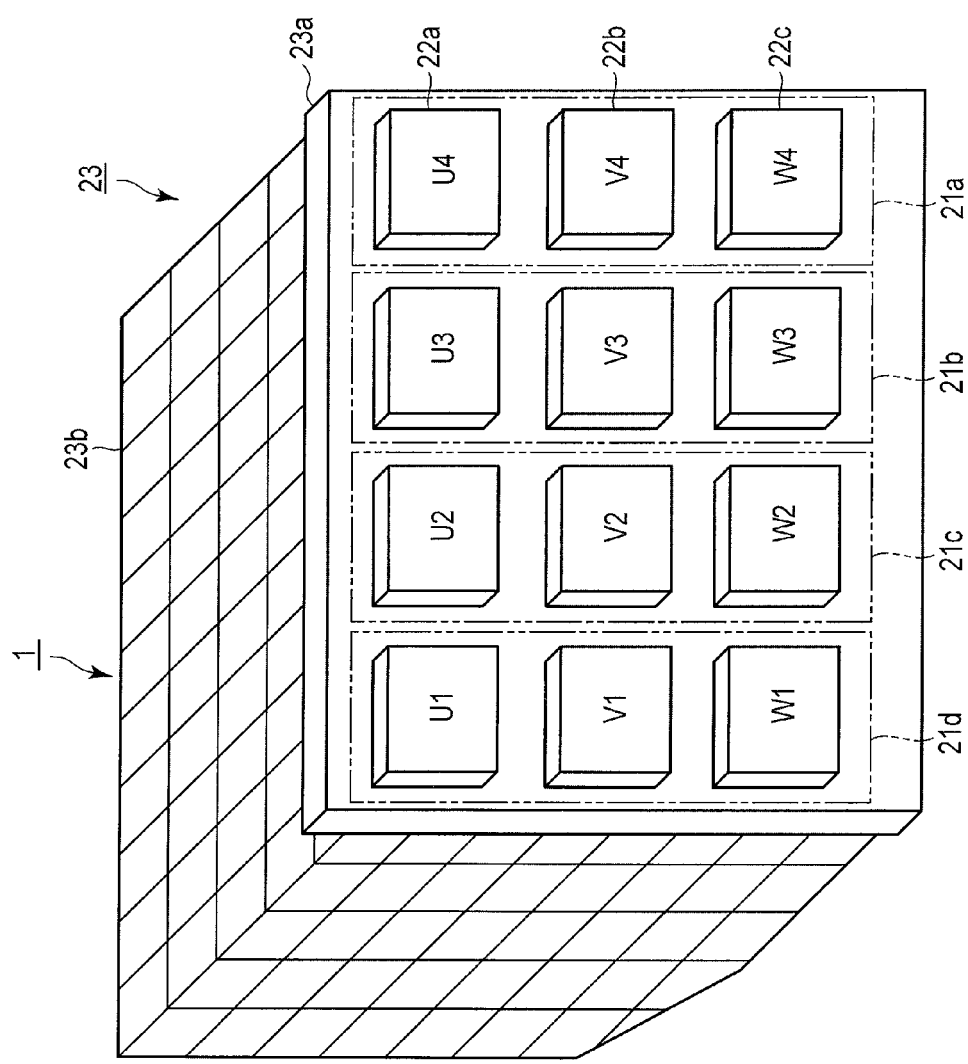
FIG. 4 shows an exterior of the first embodiment.

FIG. 1 shows a circuit configuration of an electric-vehicle control apparatus of the first embodiment according to the present invention. FIG. 2 is an equivalent circuit diagram of a semiconductor device package according to the first embodiment. FIG. 3 is a chart showing a voltage output and a temperature increase of a semiconductor device package according to the first embodiment. FIG. 4 is an exterior view showing the first embodiment.

Configuration of 4-in-1 Inverter Unit

The circuit configuration of the electric-vehicle control apparatus according to the present embodiment comprises a first 4-in-1 inverter unit 1, as shown in FIG. 1. On a direct-current input side, a circuit of the first 4-in-1 inverter unit 1 is configured by a pantograph 4, a high-speed breaker 5, a charging-resistor shortcircuit contactor 6, a charging resistor 7, a release contactor 8, a filter reactor 9, an overvoltage limit resistor 10, an overvoltage-limit switching element 11, a wheel 12, and a filter capacitor 14. On an alternating-current-output-side, a circuit is configured by permanent-magnet-synchronous electric motors 2 (2a, 2b, 2c, and 2d), motor release contactors 3 (3a, 3b, 3c, and 3d), and electric current sensors 34 (34a, 34b, 34c, and 34d).

The pantograph 4 is connected to the high-speed breaker 5, which is connected to the charging-resistor-shortcircuit conductor 6. The charging-resistor-shortcircuit conductor 6 is connected in parallel with the charging resistor 7 and in series with the release contactor 8. The release contactor 8 is connected to the filter reactor 9. The filter reactor 9 is connected to a positive direct-current terminal of the first 4-in-1 inverter unit 1, and a negative direct-current terminal is connected to a wheel 12. An overvoltage-limit serial circuit 19 configured by serially connecting the overvoltage limit resistor 10 and the overvoltage-limit-control switching element 11 is connected, at one terminal, to the filter reactor 9 and the positive direct-current terminal of the first 4-in-1 inverter unit 1, and is connected, at another terminal, to the negative direct-current terminal of the first 4-in-1 inverter unit 1 and the wheel 12. The filter capacitor 14 and the direct-current voltage sensor 15 each are connected in parallel on the direct current side of the first 4-in-1 inverter unit 1. On the alternating current side of the first 4-in-1 inverter unit 1, current sensors 34a, 34b, 34c, and 34d are provided on two lines among output three-phase lines. Connected to the alternating current side are four permanent-magnet synchronous motors 2a, 2b, 2c, and 2d through the motor release contactors 3a, 3b, 3c, and 3d.

The first 4-in-1 inverter unit 1 is configured by VVVF inverters 21a to 21d, and VVVF inverters 21a to 21d are connected in parallel with each other on the direct current side.

VVVF inverter 21a is configured by a U-phase semiconductor device package 22a, a V-phase-semiconductor device package 22b, a W-phase-semiconductor device package 22c, and an inverter filter capacitor 13a. U-, V-, and W-phase semiconductor device packages 22a to 22c are connected in parallel with each other on the direct current side, and are connected in parallel with the inverter filter capacitor 13a. VVVF inverters 21b to 21d each are configured in the same manner as VVVF inverter 21a.

Figure 10:
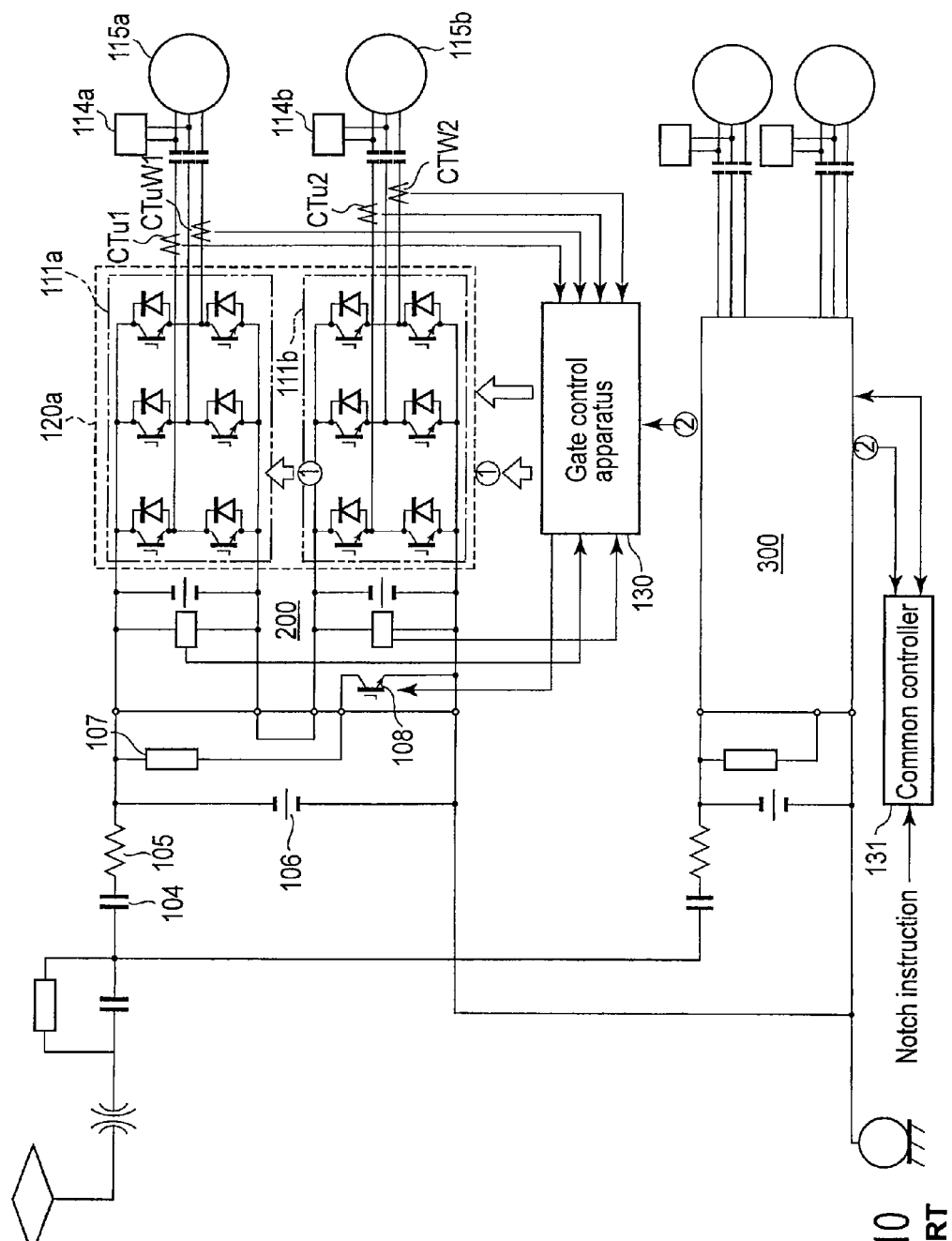
FIG. 10 shows a conventional control configuration.

The configuration of the control system is the same as FIG. 10, and each inverter 111 is controlled individually.

Configuration of Semiconductor Device Package

FIG. 2 is an equivalent circuit diagram of a semiconductor device package 22. FIG. 3 shows a switching state of a semiconductor device in the semiconductor device package, and a temperature state of the semiconductor device package by switching thereof.

As shown in FIG. 2, the semiconductor device package 22 is configured by a serial circuit of a positive element 24a of an upper arm and a negative element 24b of a lower arm. This serial circuit is connected in parallel to the capacitor 13. The positive element 24a of the upper arm is a parallel connection circuit of a switching element Tr1 and a diode D1. The negative element 24b of the lower arm is an parallel connection circuit of a switching element Tr2 and a diode D2. A connection point 26 between the positive element 24a and the negative element 24b is connected to an output terminal, and an output voltage is thereby provided.

The switching element Tr1 of the positive element 24a is turned on, and the switching element Tr2 of the negative element 24b is turned off. Then, an output current is made flow to a load through the switching element Tr1 and output terminal from a power line. Meanwhile, the switching element Tr1 of the positive element 24a is turned off, and the switching element Tr2 of the negative element 24b is turned on. Then, an output current is made flow from a load through the switching element Tr1 and an output terminal to a negative power-supply side. By repeating such switching, the direct current power is converted into an alternating power.

FIG. 3(a) shows a waveform of a switching voltage (gate signal) waveform of the positive element 24a, and FIG. 3(b) shows a switching voltage waveform of the negative terminal 24b. FIG. 3(c) is an output voltage waveform of a semiconductor device package 22. FIG. 3(d) is a graph showing a temperature increase of the positive element 24a. FIG. 3(e) is a graph showing a temperature increase of the negative terminal 24b.

As shown in FIG. 3(d), the temperature of the positive element 24a increases when the positive element 24a shown in FIG. 3(a) is on. The temperature does not substantially change when the positive element 24a is off. Therefore, the temperature of the positive element 24a gradually increases as switching operation of on/off is repeated. As shown in FIG. 3(e), the temperature of the negative element 24b gradually increases as switching operation of on/off is repeated. Here, the on state of the positive element 24a and the on state of the negative element 24b are alternately repeated. Therefore, the entire heat generation of the semiconductor device package 22 is constant as shown in FIG. 3(f).

The 4-in-1 inverter unit 1 is configured by packaging, into a unit, the four VVVF inverters 21a to 21d which use the semiconductor device package 22 as described for each phase. FIG. 4 shows an exterior of the first 4-in-1 inverter unit 1 thereof.

As shown in FIG. 4, the first 4-in-1 inverter unit 1 is configured by providing four three-phase VVVF inverters 21a to 21d on one cooling mechanism 23. VVVF inverters 21a to 21d are attached to a flat surface of a heat receiving plate 23a forming part of the cooling mechanism 23. To a surface of the heat receiving plate 23a opposite to the flat surface to which VVVF inverters 21a to 21d are attached, a heat radiator 23b forming the other part of the cooling mechanism 23 is connected.

Operation

The operation of the electric-vehicle control apparatus according to the present embodiment will be described.

In FIG. 1, a direct current supplied from a power line through the pantograph 4 is supplied to the filter capacitor 14 through the high-speed breaker 5 which is normally on, the charging resistor 7, the release contactor 8 which is also normally on, and the filter reactor 9. A direct current flows through the capacitors 13a to 13d of the inverters connected in parallel with the filter capacitor 14, and sufficient charges are stored. Then, the charging-resistor shortcircuit contactor 6 turns on, and the direct current from the power line is supplied to the first 4-in-1 inverter unit 1 through the high-speed breaker 5, charging-resistor shortcircuit contactor 6, release contactor 8, and filter reactor 9.

When the inverter filter capacitor 13a-13d is fully charged and when direct-current line power is supplied to the first 4-in-1 inverter unit 1, a direct current voltage is applied to semiconductor devices included in UVW-phase semiconductor device packages 22a to 22c in each of VVVF inverters 21a to 21d. The supplied direct power is converted into alternating current power by switching of the semiconductor elements. The converted alternating-current power is supplied to and started to drive the four permanent-magnet synchronous motors 2.

In the present embodiment, for example, when the first 4-in-1 inverter unit 1 is applied with a power-line voltage of 1500 V, the same 1500 V is applied to each of VVVF inverters 21a to 21d. The voltage of 1500 V is applied to each of VVVF inverters 21a to 21d, a corresponding current to the voltage flows through the permanent-magnet synchronous motor 2, and drives the permanent-magnet synchronous motor 2.

Thus, the permanent-magnet synchronous motor 2 is driven by power conversion of converting direct-current power of the first 4-in-1 inverter unit 1 into an alternating-current power. However, power conversion loss occurs at the time of electric power conversion. The electric-power conversion loss is caused as heat from a semiconductor device. Generated heat transfers to the heat receiving plate 23a, then transfers from the heat receiving plate 23a to the heat radiator 23b, and is radiated out of the heat radiator 23b. That is, the heat generated by power conversion loss does not stay in the vehicle but is radiated to outside.

Further, if one VVVF inverter 21 malfunctions in the first 4-in-1 inverter unit 1 during work of the electric-vehicle control apparatus and if the control apparatus (not shown) detects the malfunctioning, all the four VVVF inverters 21a-21d are released by releasing the high-speed breaker 5 (FIG. 1).

Further, if the direct-current power sensor 15 detects excess of the direct-current voltage supplied to the first 4-in-1 inverter unit 1 by variation of the power-line voltage during work of the electric-vehicle control apparatus, the overvoltage-limit switching element 11 is turned on, thereby to consume the direct-current power by the overvoltage limit resistor 10, and to remove an excess of the voltage. Thus, the overvoltage-limit switching element 11 is controlled to turn on/off, based on an output of the direct-current voltage sensor 15.

Effects

In the electric-vehicle control apparatus configured in this manner, VVVF inverters 21a to 21d each having WW-phase semiconductor device packages 22a to 22c share the heat radiator 23b. Therefore, a heat generation amount of the first 4-in-1 inverter unit 1 which contains VVVF inverters 21a to 21d is equalized over the entire unit, and can therefore be efficiently cooled. Further, if semiconductor elements are individually set on a heat radiator as in the conventional elements, a setting space for twenty four semiconductor elements is required. In the present embodiment, however, use efficiency of the cooler 23 improves and space saving can be performed, by using the device package 22 which contains two semiconductor devices so as to equalize the heat generation amounts of respective semiconductor devices. As a result of this, the 4-in-1 inverter unit in which twelve semiconductor device packages 22 are attached to the heat radiator 23 can be configured.

Further, the filter reactor 9, overvoltage limit resistor 10, overvoltage-limit switching element 11 are shared in one apparatus. Accordingly, the number of components is reduced, and the entire electric-vehicle apparatus can be made smaller.

Further, the direct-current voltage sensor 15, current sensors 34a to 34d, and motor release contactors 3a to 3d can be contained in the 4-in-1 inverter unit 1. In this case, a further effect of space saving is achieved, and wiring is simplified by containing a great number of components in a housing. Manufacture, placement, and maintenance of the entire apparatus can be facilitated.

Second Embodiment

The second embodiment of the invention will be described with reference to the drawings.

FIG. 5 shows a circuit configuration of the second embodiment. The same components as those in FIGS. 1 to 4 are respectively denoted at the same reference signs, and descriptions thereof will be omitted herefrom.

Configuration

The circuit configuration of the present embodiment differs from the circuit configuration of the first embodiment in that a different connection method is employed for VVVF inverters 21a to 21d forming the 4-in-1 inverter unit, and in that, on the direct-current side of each inverter 21, the direct-current voltage sensor 32 and inverter filter capacitor 13 each are connected in parallel. In this respect, descriptions will now be made below.

A second 4-in-1 inverter unit 30 is configured by VVVF inverters 21a to 21d. VVVF inverters 21a and 21b connected in series form a serial inverter circuit 33a. VVVF inverters 21c and 21d form a serial inverter circuit 33b. The serial inverter circuits 33a and 33b are connected in parallel with each other.

On the direct-current side of VVVF inverter 21a, the inverter filter capacitor 13a and the direct-current voltage sensor 32a are connected in parallel. VVVF inverters 21c and 21d have the same configuration as VVVF inverters 21a and 21b. The inverter filter capacitors 13c and 13d and the direct-current voltage sensors 32c and 32d are connected in parallel on the direct-current side.

Operation

The operation of the electric-vehicle control apparatus according to the present embodiment will be described.

In FIG. 5, for example, when a second 4-in-1 inverter unit 30 is applied with a power-line voltage of 1500 V, the voltage of 1500 V is applied to each of the serial inverter circuits 33a and 33b. In each of the serial inverter circuits 33a and 33b, the power-line voltage of 1500 V is divided into two partial voltages. A voltage of 750 V is applied to each of VVVF inverters 21a to 21d, and a current corresponding to the voltage flows through a permanent-magnet synchronous motor 2, and drives the permanent-magnet synchronous motor 2.

At this time, the direct-current voltage sensor 32a detects a direct-current-side voltage of VVVF inverter unit 21a. Similarly, the direct-current voltage sensors 32b to 32c respectively detect direct-current-side voltages of VVVF inverter units 21b to 21d.

Effects

An effect of the electric-vehicle control apparatus according to the second embodiment is that the voltage applied to each of VVVF inverters 21 is a voltage obtained by dividing the power-line voltage by two. That is, switching of the semiconductor devices is performed at a lower voltage than the first embodiment. Therefore, heat generated as power conversion loss can be reduced. Since heat generation is reduced, the cooling mechanism can be made smaller, and energy can be saved during driving of the apparatus.

By detecting a direct-current-side voltage value of each VVVF inverter 21 by using the direct-current voltage sensor 32. The inverters can be controlled more accurately.

Third Embodiment

The third embodiment of the invention will be described with reference to the drawings.

Figure 6:
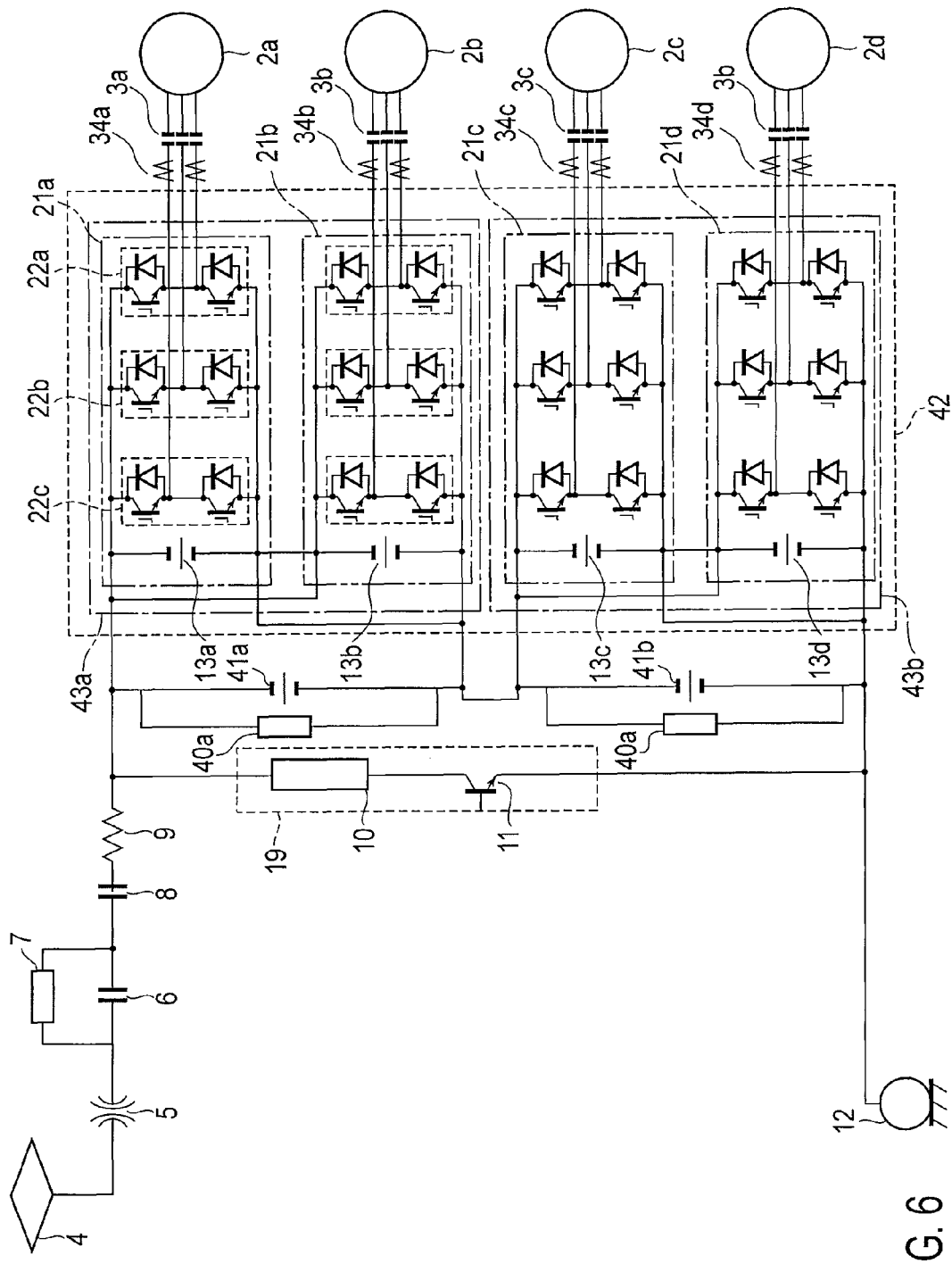
FIG. 6 shows a circuit configuration of the third embodiment.

FIG. 6 shows a circuit configuration of the third embodiment. The same components as those in FIGS. 1 to 4 are respectively denoted at the same reference signs, and descriptions thereof will be omitted herefrom.

Configuration

The circuit configuration of the present embodiment differs from the circuit configuration of the first embodiment in that a different connection method is employed for VVVF inverters 21a to 21d forming a 4-in-1 inverter unit, and in that, on the direct-current side of each inverter 21, a direct-current voltage sensor 40 and a filter capacitor 41 each are provided. In this respect, descriptions will be made below.

In FIG. 6, a third 4-in-1 inverter unit 42 is configured by VVVF inverters 21a to 21d. VVVF inverters 21a and 21b connected in series form a parallel inverter circuit 43a. VVVF inverters 21c and 21d form a parallel inverter circuit 43b. The parallel inverter circuits 43a and 43b are connected in parallel with each other. On the direct-current side of VVVF inverter 43a, the filter capacitor 41a and the direct-current voltage sensor 40a are connected in parallel. Similarly, the parallel inverter circuit 40b is connected to each of the filter capacitor 41b and the direct-current voltage sensor 40b.

Operation

Next, operation of the present embodiment will be described.

In the present embodiment, for example, when a third 4-in-1 inverter unit 42 is applied with a power-line voltage of 1500 V, a divided voltage of 750 V is applied to each of the parallel inverter circuits 43a and 43b. When the parallel inverter circuits 43a and 43b each are applied with the voltage 750 V, the voltage of 750 V is applied to each of VVVF inverters 21a to 21d. A current corresponding to the voltage flows through a permanent-magnet synchronous motor 2, and drives the permanent-magnet synchronous motor 2.

Effects

The present embodiment can achieve the same effects as the first embodiment. That is, the voltage applied to each of VVVF inverters is a voltage obtained by dividing twice the power-line voltage. That is, switching of the semiconductor devices is performed at a lower voltage than the first embodiment. Therefore, heat generated as power conversion loss can be reduced. Since heat generation is reduced, the cooling mechanism can be made smaller, and energy can be saved during driving of the apparatus.

Since the direct-current side of parallel inverter circuits 43a and 43b are detected by direct-current voltage sensors 40a and 40b, the number of components can be smaller than the second embodiment.

Fourth Embodiment

The fourth embodiment of the invention will be described with reference to the drawings.

Figure 7:
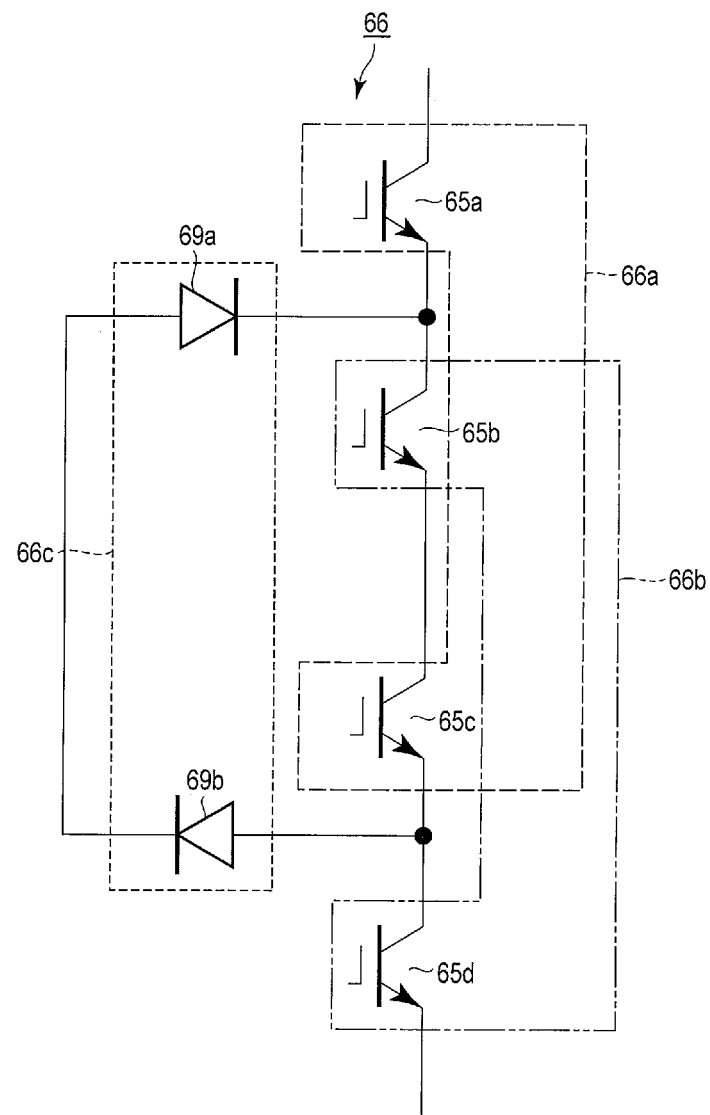
FIG. 7 is a U-phase circuit configuration of a 3-level power conversion apparatus according to the fourth embodiment.
Figure 8:
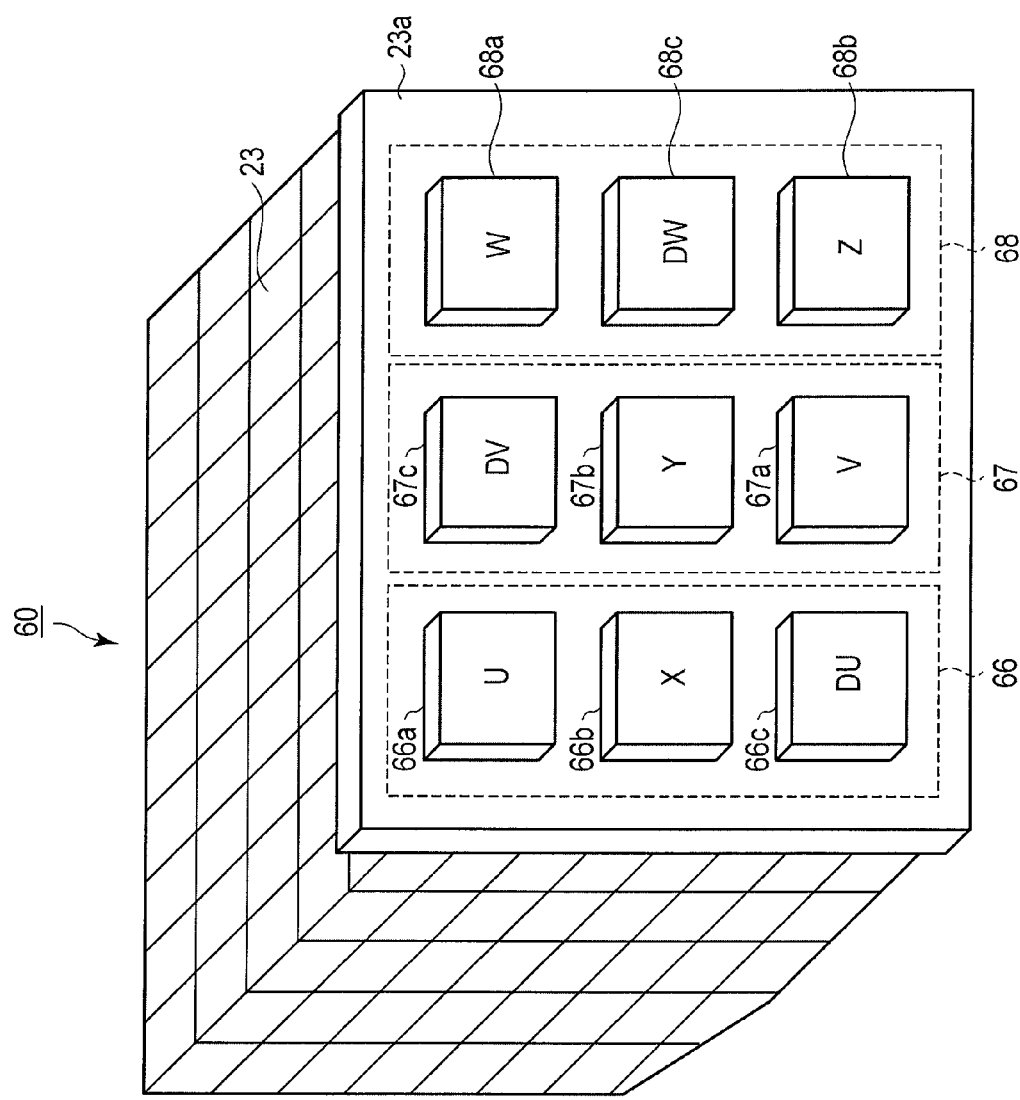
FIG. 8 is an exterior view of the 3-level power conversion apparatus according to the fourth embodiment.
Figure 9:
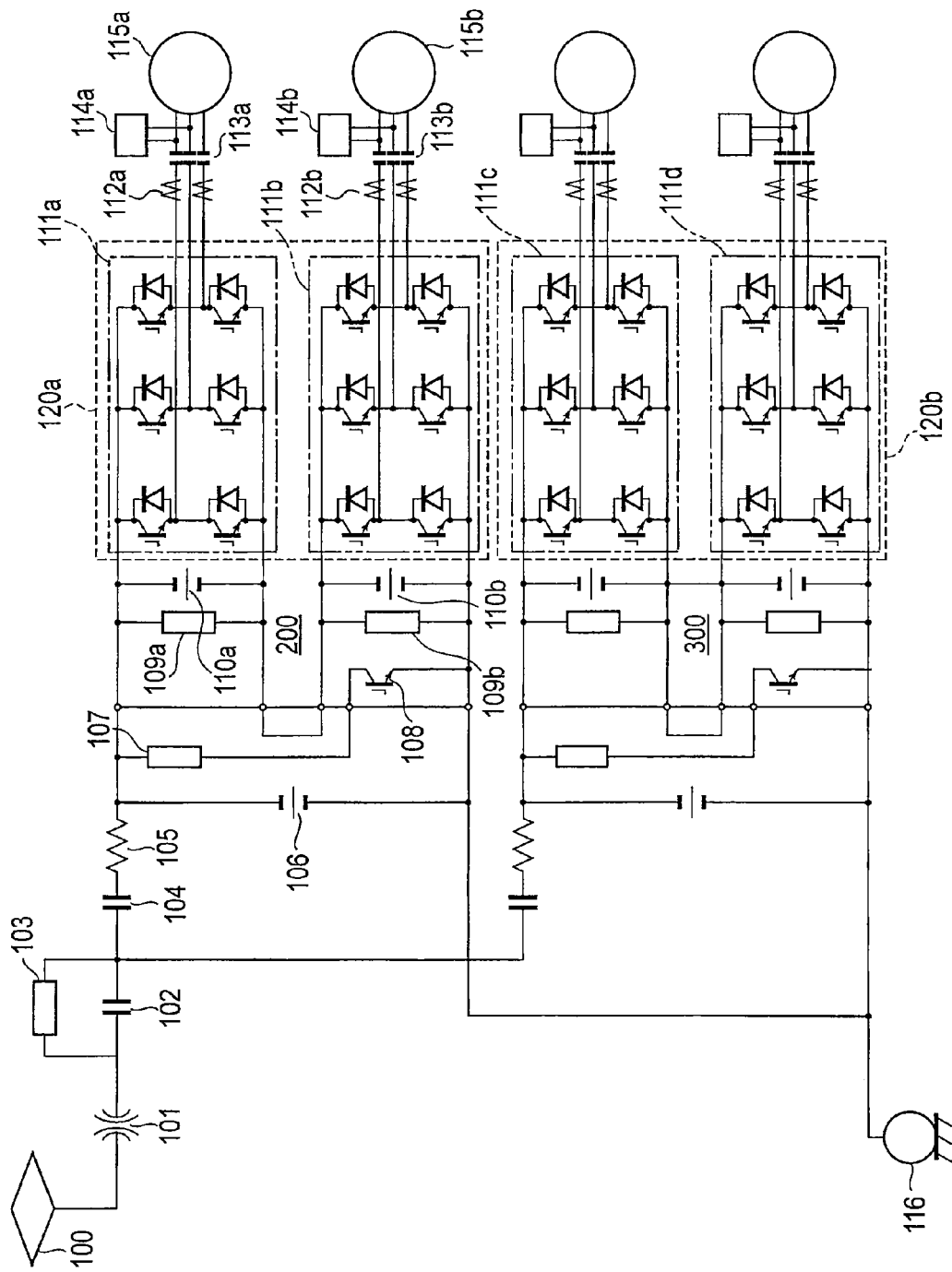
FIG. 9 shows a conventional circuit configuration.

FIG. 7 is a circuit diagram of one of U, V, and W phases of 3-level power conversion apparatus according to the fourth embodiment. Hereinafter, this phase is referred to as a U-phase. FIG. 8 is an exterior view showing the fourth embodiment. The same components as those in FIGS. 1 to 4 are respectively denoted at the same reference signs, and descriptions thereof will be omitted herefrom.

Configuration

The fourth embodiment is a modification of a semiconductor device package 22 (2-level output) according to the first embodiment into a semiconductor device package 22 of a 3-level output, and is applied to the inverter unit. The modification will now be described below.

FIG. 7 shows a circuit configuration of the U-phase of the 3-level power conversion apparatus according to the present embodiment. This U-phase circuit comprises a first element 65a, a second element 65b, a third element 65c, a fourth element 65d, and a first clamp diode 69a, and a second clump diode 69b.

A serial U-phase circuit is configured by serially connecting the first element 65a, second element 65b, third element 65c, and fourth element 65d. The first clump diode 69a and second clump diode 69b are connected in series. An anode of the first clump diode 69a is connected between the first element 65a and the second element 65b. A cathode of the second clump diode 69b is connected between the third element 65c and the fourth element 65d. The first element 65a and the third element 65c are contained in the first U-phase semiconductor device package 66a. The second element 65b and fourth element 65d are contained in the second U-phase semiconductor device package 66d.

FIG. 8 is an exterior view of a power conversion apparatus according to the fourth embodiment.

In FIG. 8, a first V-phase semiconductor device package 67a, a second V-phase semiconductor device package 67b, and a third V-phase semiconductor device package 67c of a V-phase circuit 67, a first W-phase semiconductor device package 68a, a second W-phase semiconductor device package 68b, and a third W-phase semiconductor device package 68c of the W-phase circuit 68 are commonly configured in the same manner as the U-phase circuit 66.

Next, the U-phase circuit 66, V-phase circuit 67, and W-phase circuit 68 are set on a heat receiving plate 23a of the cooling mechanism.

As shown in FIG. 8, the U-phase circuit 66 and the W-phase circuit 68 are provided on two sides of the heat receiving plate 23a. The V-phase circuit 67 is provided between the U-phase circuit 66 and the W-phase circuit 68. In the U-phase circuit 66, a first U-phase semiconductor device package 66a, a second U-phase semiconductor device package 66b, and a third U-phase semiconductor device package 66c are provided in this order from upside. In the V-phase circuit 67, a first V-phase semiconductor device package 67a, a second V-phase semiconductor device package 67b, and a third V-phase semiconductor device package 67c are provided in this order from upside. In the W-phase circuit 68, a first W-phase semiconductor device package 68a, a second W-phase semiconductor device package 68b, and a third W-phase semiconductor device package 68c are provided in this order from upside.

Operation

In the U-phase circuit 66, when a semiconductor element performs switching for power conversion, inductances of the second element 65b and the third element 65c are the greatest. That is, heat generation from the second element 65b and third element 65c is the greatest. Next, a heat generation amount from the first element 65a and fourth element 65d is the greatest. A heat generation amount from the first clump diode 69a and the second clump diode 69b is the smallest. The same as described above also applies to the V-phase circuit 67 and W-phase circuit 68. Therefore, a heat generation amount generated from the first semiconductor device package 66a (67a and 68a as well) which contains the first element 65a and the third element 65c combined with each other is equal to a heat generation amount generated from the second semiconductor device package 66b (67b and 68b as well). A heat generation amount from the third semiconductor device package 66c (67c and 68c as well) which contains a first clump diode 69a and a second clump diode 69b combined with each other is lower than a heat generation amount generated from the first semiconductor device packages 66a, 67a, and 68a and the second semiconductor device packages 66b, 67b, and 68b.

Effects

The electric-vehicle control apparatus configured as described above is arranged so as to sandwich the third semiconductor device packages 66c, 67c, and 68c between the first semiconductor device packages 66a, 67a, and 68a and the second semiconductor device packages 66b, 67b, and 68b. In this manner, the heat transferred to the heat receiving plate 23a is made uniform throughout the entire heat receiving plate 23a, and efficient cooling can be achieved by the cooling mechanism 23. Further, the 3-level power conversion apparatus having a greater number of semiconductor elements can be made even smaller than in a conventional apparatus.

The semiconductor device package 22 can be applied not only to a 4-in-1 inverter unit in which four VVVF inverter units 21 are mounted on one cooling mechanism as shown in the first to fourth embodiments but also to a different configuration such as 2-in-1 inverter unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inverter unit that supplies alternating-current power for driving four motors, comprising:
    four inverters each including a U-phase circuit, a V-phase circuit, and a W-phase circuit, each inverter for driving a corresponding one of the four motors, wherein each phase of each of the four inverters comprises a semiconductor device package including at least two semiconductor switching elements;
    a heat receiving plate having a surface to which the U-phase circuits, the V-phase circuits, and the W-phase circuits of the four inverters are attached; and
    a heat radiator that radiates heat from the heat receiving plate;
    wherein the U-phase circuits, the V-phase circuits, and the W-phase circuits of the four inverters are laid out in a matrix pattern on the heat receiving plate such that (1) the U-phase circuit, the V-phase circuit, and the W-phase circuit for each respective of the four inverters is laid out in a line on the heat receiving plate, and (2) the U-phase circuits of each of the four inverters are laid out in a line, (3) the V-phase circuits of each of the four inverters are laid out in a line, and (4) the W-phase circuits of each of the four inverters are laid out in a line.

2. The inverter unit according to claim 1, wherein
    a U-phase semiconductor device package of the inverter is configured by a U-phase upper arm and a U-phase lower arm,
    a V-phase semiconductor device package is configured by a V-phase upper arm and a V-phase lower arm, and
    a W-phase semiconductor device package is configured by a W-phase upper arm and a W-phase lower arm.

3. The inverter unit according to claim 1, wherein
    the plurality of inverters each are controlled individually, and
    the inverter unit comprises a first parallel circuit configured by first and second inverters connected in parallel with each other on a direct-current side, and a second parallel circuit configured by third and fourth inverters connected in parallel with each other on a direct current side, the first and second parallel circuits are connected in series with each other on the direct-current side, and an applied voltage to each of the inverters is ½ of the applied voltage to the inverter unit.

4. The inverter unit according to claim 1, wherein
    the plurality of inverters each are controlled individually, and
    the inverter unit comprises a first serial circuit configured by first and second inverters connected in series with each other on a direct-current side, and a second serial circuit configured by third and fourth inverters connected in series with each other on a direct current side, the first and second serial circuits are connected in parallel with each other on the direct-current side, and an applied voltage to each of the inverters is ½ of the applied voltage to the inverter unit.

5. The inverter unit according to claim 1, wherein the four motors each have a permanent magnet.

6. An electric-vehicle control apparatus of an electric vehicle, comprising:
    an inverter unit that supplies alternating-current power for driving four motors of the electric vehicle, comprising:
        four inverters, each including a U-phase circuit, a V-phase circuit, and a W-phase circuit, each inverter for driving a corresponding one of the four motors, wherein each phase of each of the four inverters comprises a semiconductor device package including two semiconductor switching elements that are connected in series to each other;

a heat receiving plate having a surface to which the U-phase circuits, the V-phase circuits, and the W-phase circuits of the four inverters are attached; and a heat radiator that radiates heat from the heat receiving plate; and wherein the U-phase circuits, the V-phase circuits, and the W-phase circuits of the four inverters are laid out in a matrix pattern on the heat receiving plate such that (1) the U-phase circuit, the V-phase circuit, and the W-phase circuit for each respective of the four inverters is laid out in a line on the heat receiving plate, and (2) the U-phase circuits of each of the four inverters are laid out in a line, (3) the V-phase circuits of each of the four inverters are laid out in a line, and (4) the W-phase circuits of each of the four inverters are laid out in a line;

a filter reactor connected to a direct current side of the inverter unit;

an overvoltage-limit serial circuit configured to discharge an electric power of an overvoltage applied to the inverter; and a direct-current voltage sensor connected in parallel to the inverter unit on the direct current side thereof.

7. The electric-vehicle control apparatus according to claim 6, wherein when it is detected that a line power is excessive by the direct-current voltage sensor, the overvoltage-limit serial circuit discharges the line power.

8. The electric-vehicle control apparatus according to claim 6, wherein the plurality of inverters each are controlled individually, and the inverter unit comprises a first parallel circuit configured by first and second inverters connected in parallel with each other on a direct-current side, and a second parallel circuit configured by third and fourth inverters connected in parallel with each other on a direct current side, the first and second parallel circuits are connected in series with each other on the direct-current side, and an applied voltage to each of the inverters is ½ of the applied voltage of the line power.

9. The electric-vehicle control apparatus according to claim 6, wherein the plurality of inverters each are controlled individually, and the inverter unit comprises a first serial circuit configured by first and second inverters connected in series with each other on a direct-current side, and a second serial circuit configured by third and fourth inverters connected in series with each other on a direct current side, the first and second serial circuits are connected in parallel with each other on the direct-current side, and an applied voltage to each of the inverters is ½ of the applied voltage of the line power.

10. The electric-vehicle control apparatus according to claim 6, wherein the four motors each have a permanent magnet.

11. An inverter unit that supplies alternating-current power for driving four motors, comprising:

four inverters, each including a U-phase circuit, a V-phase circuit, and a W-phase circuit, for driving a corresponding one of the four motors;

a heat receiving plate having a surface to which the U-phase circuit, the V-phase circuit, and the W-phase circuit of the four inverters are attached; and a heat radiator that radiates heat from the heat receiving plate, wherein, each of the U-phase, V-phase, and W-phase circuits comprises first to fourth switching elements connected in series, and first and second diodes connected in series between a connection point between the first and second switching elements and a connection point between the third and fourth switching elements, the first and third switching elements are contained in one package and form a first semiconductor device package, the second and fourth switching elements are contained in one package and form a second semiconductor device package, and the first and the second diodes are contained in one package and form a third semiconductor device package, and wherein the U-phase circuits, the V-phase circuits, and the W-phase circuits of the four inverters are laid out in a matrix pattern on the heat receiving plate such that (1) the U-phase circuit, the V-phase circuit, and the W-phase circuit for each respective of the four inverters is laid out in a line on the heat receiving plate, and (2) the U-phase circuits of each of the four inverters are laid out in a line, (3) the V-phase circuits of each of the four inverters are laid out in a line, and (4) the W-phase circuits of each of the four inverters are laid out in a line.

12. The inverter unit according to claim 11, wherein the four motors each have a permanent magnet.

13. An electric-vehicle control apparatus of an electric vehicle, comprising:

an inverter unit that supplies alternating-current power for driving four motors of the electric vehicle, comprising:

four inverters, each including a U-phase circuit, a V-phase circuit, and a W-phase circuit, for driving a corresponding one of the four motors;

a heat receiving plate having a surface to which the U-phase circuit, the V-phase circuit, and the W-phase circuit of the four inverters are attached; and a heat radiator that radiates heat from the heat receiving plate, wherein, each of the U-phase, V-phase, and W-phase circuits comprises first to fourth switching elements connected in series, and first and second diodes connected in series between a connection point between the first and second switching elements and a connection point between the third and fourth switching elements, the first and third switching elements are contained in one package and form a first semiconductor device package, the second and fourth switching elements are contained in one package and form a second semiconductor device package, and the first and the second diodes are contained in one package and form a third semiconductor device package, and wherein the U-phase circuits, the V-phase circuits, and the W-phase circuits of the four inverters are laid out in a matrix pattern on the heat receiving plate such that (1) the U-phase circuit, the V-phase circuit, and the W-phase circuit for each respective of the four inverters is laid out in a line on the heat receiving plate, and (2) the U-phase circuits of each of the four inverters are laid out in a line, (3) the V-phase circuits of each of the four inverters are laid out in a line, and (4) the W-phase circuits of each of the four inverters are laid out in a line a filter reactor connected to a direct current side of the inverter unit;

an overvoltage-limit serial circuit configured to discharge an electric power of an overvoltage applied to the inverter; and a direct-current voltage sensor connected in parallel to the inverter unit on the direct current side thereof.

14. The electric-vehicle control apparatus according to claim 13, wherein the four motors each have a permanent magnet.

* * * * *